United States Patent [19]

Itagaki et al.

[11] Patent Number: 5,079,834

[45] Date of Patent: Jan. 14, 1992

[54] APPARATUS FOR AND METHOD OF MOUNTING ELECTRONIC COMPONENTS

[75] Inventors: Masato Itagaki, Kashiwa; Yoshio Haeda, Yaizu; Keisuke Fujishiro, Shimizu; Susumu Nakayama, Shizuoka, all of Japan

[73] Assignee: Hitachi, Ltd., Tokyo, Japan

[21] Appl. No.: 461,313

[22] Filed: Jan. 5, 1990

[30] Foreign Application Priority Data

Jan. 11, 1989 [JP] Japan .................... 1-2733

[51] Int. Cl.$^5$ .......................... H05K 3/34; B23P 19/00
[52] U.S. Cl. .......................... 29/840; 29/740; 29/833; 29/836; 364/491
[58] Field of Search ................ 29/740, 741, 836, 833, 29/834, 709, 703; 364/491

[56] References Cited

U.S. PATENT DOCUMENTS

| | | | |
|---|---|---|---|
| 4,202,092 | 5/1980 | Shibasaki et al. | 29/836 X |
| 4,222,036 | 9/1980 | Troukens | 29/833 X |
| 4,598,459 | 7/1986 | Klink et al. | 29/836 X |
| 4,675,993 | 6/1987 | Harada | 29/740 |
| 4,706,187 | 11/1987 | Arai et al. | 29/740 X |
| 4,738,025 | 4/1988 | Arnold | 29/740 X |
| 4,794,689 | 1/1989 | Seno et al. | 29/740 |
| 4,876,656 | 10/1989 | Leicht et al. | 364/491 |
| 4,894,790 | 1/1990 | Votsuya et al. | 364/491 X |
| 4,914,808 | 4/1990 | Okumura et al. | 29/740 |

FOREIGN PATENT DOCUMENTS

| | | | |
|---|---|---|---|
| 3602416 | 7/1987 | Fed. Rep. of Germany | 29/833 |
| 60-118458 | 6/1985 | Japan | 29/833 |

*Primary Examiner*—Carl J. Arbes
*Attorney, Agent, or Firm*—Antonelli, Terry, Stout & Kraus

[57] ABSTRACT

The present invention consists in that printed patterns on a printed circuit board and component information near the printed patterns are photographed, that the type of an electronic component to be mounted and the mounting position and mounting attitude of the electronic component are recognized from the photographed image, and that the predetermined electronic component is mounted on the predetermined position of the printed circuit board at the predetermined attitude on the basis of the above information items. Further, a program for the mounting order of all the electronic components to be mounted on the printed circuit board is generated on the basis of the image processing information items.

14 Claims, 2 Drawing Sheets

APPARATUS FOR AND METHOD OF MOUNTING ELECTRONIC COMPONENTS

BACKGROUND OF THE INVENTION

The present invention relates to an electronic-component mounting apparatus and mounting method which mount small-sized electronic components on printed circuit boards.

With an electronic-component mounting apparatus in the prior art, NC data on a mounting order has been generated in such a way that an operator reads the X-, Y- and θ-coordinates of a printed circuit board for mounting electronic components thereat, and the types of the components from shop drawings or the like, and that the operator himself/herself inputs them manually from a keyboard by the use of a data generation equipment. In addition, CAD data has been sometimes employed for users on the scales of various and mass products. In that case, component data has been transferred directly to the data generation equipment.

Known examples of this type are disclosed in Japanese Patent Application Laid-open No. 144392/1987, Japanese Patent Application Laid-open No. 62590/1987, etc.

The prior art is very laborious because the operator himself/herself inputs the mounting-order NC data from the keyboard of the data generation equipment every lot. Particularly in a production aspect of small lot scales and many lots, the operations of generating the NC data are very troublesome, but it has not been considered to save the labor of the operations. Incidentally, when the CAD data in the case of designing the printed circuit board is utilized, the NC data generating operation can be somewhat relieved. However, when the lot scale is small, there is no CAD data in many cases, and this technique is not applicable. Further, even when the X-, Y-and θ-coordinates of the component are obtained from the CAD data, precise X-, Y- and θ-coordinates on an X-Y table are not attainable and a mounting error is liable to develop, on account of a setting error involved when the printed circuit board is set on the X-Y table.

Meanwhile, with a technique wherein the type of a printed circuit board is read so as to select a mounting datum from within a data file, it is conditioned that mounting data items for printed circuit boards are stored beforehand. The technique has the disadvantages that the labor of preparing the mounting data is expended, and that a printed circuit board for which no mounting datum is stored cannot be coped with.

SUMMARY OF THE INVENTION

An object of the present invention is to provide an electronic-component mounting apparatus and mounting method which dispense with the operator's labor of inputting mounting-order NC data from a keyboard every lot and which can automatically generate component mounting data for various printed circuit boards.

Another object of the present invention is to provide an electronic-component mounting apparatus and mounting method which can mount an electronic component on a printed circuit board without a mounting error.

Still another object of the present invention is to provide an electronic-component mounting apparatus and mounting method in which mounting data for various printed circuit boards need not be stored in a data file or the like beforehand.

The present invention for accomplishing the objects consists in an electronic-component mounting apparatus comprising component feed means for feeding electronic components; an X-Y table on which a printed circuit board is placed; component mounting means for mounting the electronic components from said component feed means on predetermined positions of the printed circuit board; a camera which is disposed over said X-Y table, and which photographs printed patterns and component information of the printed circuit board; and an image processor which stores therein known patterns corresponding to all pad patterns printed on printed circuit boards and known letter patterns indicating types of electronic components, and which processes an image photographed by said camera and recognizes the letter pattern and the pad patterns on the printed circuit board agreeing with the known patterns, to recognize the type of the component from the recognized letter pattern and to recognize coordinates of pads near the letter pattern, thereby to determine a mounting position and a mounting angle of the recognized electronic component; so that the predetermined electronic component is mounted on the predetermined position of the printed circuit board at the predetermined mounting angle on the basis of the information from said image processor.

Another feature of the present invention consists in an electronic-component mounting apparatus comprising component feed means for feeding electronic components; an X-Y table on which a printed circuit board is placed; component mounting means for mounting the electronic components from said component feed means on predetermined positions of the printed circuit board; a camera which is disposed over said X-Y table, and which photographs printed patterns of the printed circuit board and component information thereof near the printed patterns; and an image processor which processes an image photographed by said camera, to recognize a type of the electronic component to-be-mounted from a letter pattern indicating the component information and to evaluate coordinates of pad patterns near the component and recognize the mounting position and a mounting attitude of the electronic component to-be-mounted; so that the predetermined electronic component is mounted on the predetermined position of the printed circuit board at the predetermined attitude on the basis of the information from said image processor.

Another feature of the present invention consists in an electronic-component mounting apparatus comprising component feed means for feeding electronic components; a table on which a printed circuit board is placed; component mounting means for mounting the electronic components from said component feed means on predetermined positions of the printed circuit board; a camera which photographs printed patterns on the printed circuit board and component information near the printed patterns; and an image processor which processes an image photographed by said camera, to recognize the mounting positions and mounting attitudes of the electronic components to-be-mounted and to generate a mounting order program for determining an order of mounting the electronic components to-be-mounted on the printed circuit board; so that the predetermined electronic components are successively mounted on the predetermined positions of the printed circuit board at the predetermined attitudes on the basis of the information from said image processor.

Besides, another feature of the present invention consists in an electronic-component mounting method comprising the steps of photographing printed patterns on a printed circuit board and component information near the printed patterns, recognizing a letter pattern indicative of the component information and pad patterns near the letter pattern from an image photographed, recognizing a type of the electronic component to-be-mounted from the letter pattern and a mounting position and a mounting attitude of the electronic component to-be-mounted from the pad patterns, and mounting the predetermined electronic component on the predetermined position of the printed circuit board at the predetermined attitude on the basis of the above information items.

A further feature of the present invention consists in an electronic-component mounting method comprising the steps of photographing printed patterns on a printed circuit board and information items on types of components near the printed patterns, recognizing letter patterns indicative of the component information items and pad patterns near the letter patterns from an image photographed, recognizing the types of the electronic components to-be-mounted from the letter patterns and mounting positions and mounting attitudes of the electronic components to-be-mounted from the pad patterns, further determining an order of mounting the electronic components to-be-mounted on the printed circuit board, and subsequently mounting the predetermined electronic components on the predetermined positions of the printed circuit board at the predetermined attitudes successively in the predetermined order.

A still further feature of the present invention consists in an electronic-component mounting method comprising the steps of photographing printed patterns on a printed circuit board and information items on types of components near the printed patterns, determining the types and a mounting order of the electronic components to-be-mounted on the basis of image processing information items photographed and CAD information items in the case where the printed circuit board is fabricated, further recognizing mounting positions and mounting attitudes of the electronic components to-be-mounted, and subsequently mounting the predetermined electronic components on the predetermined positions of the printed circuit board at the predetermined attitudes successively in the predetermined order.

On a printed circuit board, a pair of substantially square pads (electric terminals) and electric patterns made of fine wiring lines each having a width equal to several tenths of one side of the pad are formed at a position at which a component is to be mounted, and letters of symbols indicating the type of the component are printed near the pads.

In the present invention, such pad patterns and letter (symbol) patterns are stored beforehand, the printed circuit board is photographed by a camera, and the pair of pads are identified through the image processing of the photographed image, thereby to evaluate the X-, Y- and θ-coordinates of the mounting position of the electronic component. Further, the letters or symbols near the pads are recognized so as to find the type of the component to-be-mounted. NC data on the order of mounting respective electronic components on the printed circuit board is automatically generated on the basis of the data items as mentioned above, and the predetermined electronic components can be mounted on the predetermined positions of the printed circuit board at predetermined attitudes successively in the predetermined order on the basis of the NC data.

DESCRIPTION OF THE PREFERRED EMBODIMENTS

Coping particularly with a case of small lot scales and many lots, the present invention consists in that the printed patterns of an acutal printed circuit board are recognized by a built-in visual device (camera), whereupon NC data on the order of mounting electronic components is automatically generated.

Besides, the present invention consists in that a camera for imaging the whole or part of a printed circuit board is arranged over an X-Y table on which the printed circuit board is placed and positioned, that the camera photographs the printed patterns of each of printed circuit boards successively fed and letters or symbols indicated near the printed patterns, and that the X-, Y- and θ-coordinates of the mounting positions of electronic components and the types of the components are recognized from the obtained image by the use of an image processor.

Now, practicable embodiments of the present invention will be described with reference to the drawings.

Figure 1:
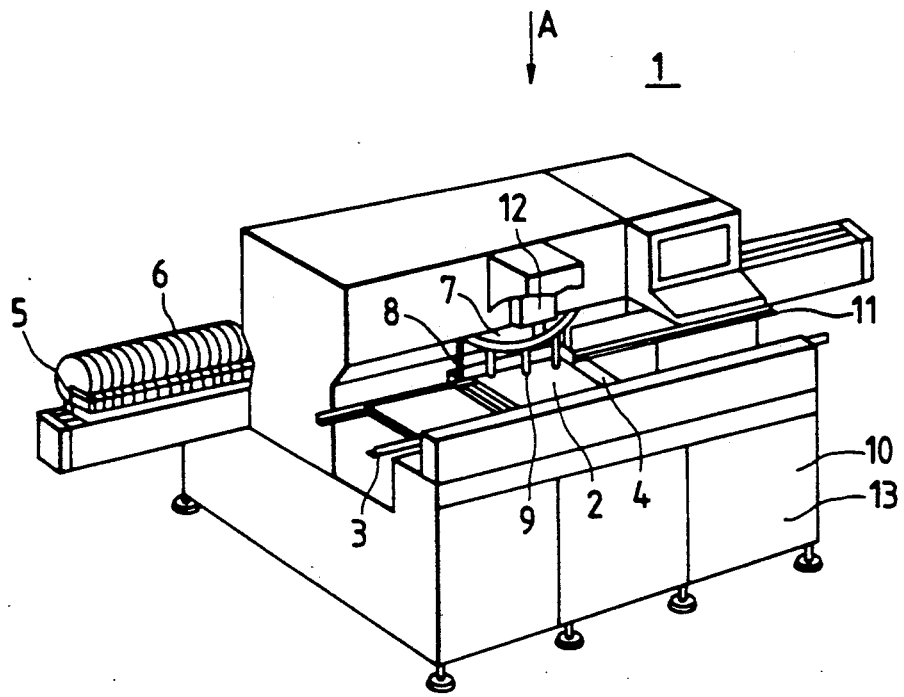
FIG. 1 is a perspective view showing an embodiment of an electronic-component mounting apparatus according to the present invention.

FIG. 1 is a general constructional view showing an electronic-component mounting apparatus according to the present invention. Mounting-order NC data generation means for mounting electronic components on a printed circuit board 2 is incorporated in the electronic-component mounting apparatus 1 of the present invention. The mounting-order NC data generation means includes an industrial camera 12 which photographs the printed circuit board 2, and an image processor 13 which processes an image taken by the camera 12, so as to recognize the types of the electronic components to-be-mounted and the mounting positions and mounting attitudes thereof on the printed circuit board 2. It contains an algorithm which determines the order of mounting the individual electronic components on the printed circuit board. In particular, the algorithm is furnished with data optimum-edit program generation means for determining the mounting order so that the period of time for mounting all the electronic components on the printed circuit board may become the shortest.

Figure 2:
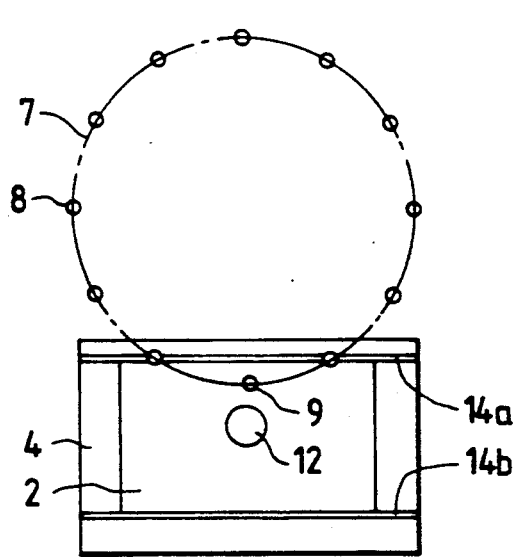
FIG. 2 is a view of an X-Y table seen in a direction A in FIG. 1.

The printed circuit board 2 is taken in by an inlet conveyer 3, and is placed on an X-Y table 4. The electronic components to be mounted are successively drawn by suction from a component feeder 6 on a component feed table 5 disposed at the rear part of the apparatus, by means of a plurality of mounting heads 8 erected on an indexing rotary disc 7. Referring to FIG. 2, each of the electronic components drawn by suction is mounted on the mounting position 9 of the printed circuit board 2 is conformity with a mounting-order program generated according to a controller 10. An outlet conveyer 11 is provided downstream of the X-Y table 4, and it takes out the printed circuit board 2 on which all the electronic components have been mounted. The camera 12 for photographing the whole or part of the printed circuit board 2 is disposed over the X-Y table 4, and an image obtained by the photographing is transferred to the image processor 13 within the controller 10 in on-line fashion.

Figure 3:
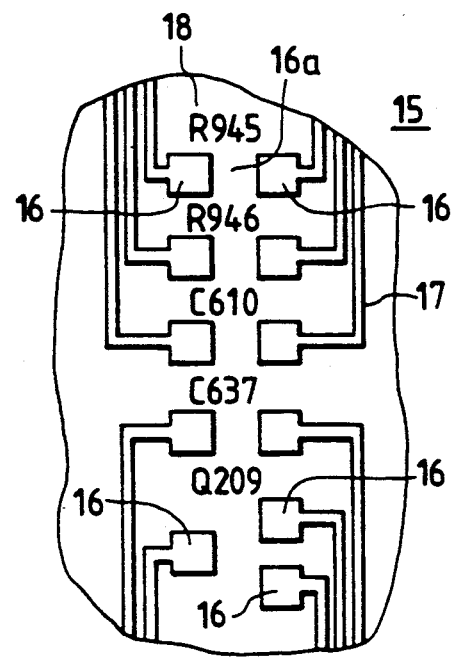
FIG. 3 is a view of part of the front surface of a printed circuit board as photographed by a camera.

As shown in FIG. 2, the camera 12 is installed on the outer side of the indexing rotary disc 7 beyond the mounting position 9 and over the X-Y table 4. That is, the camera 12 for photographing the printed circuit board 2 overlies this printed circuit board 2 fixed to circuit board guides 14a and 14b. By the way, the camera 12 may be located anywhere as long as it overlies the X-Y table, and a camera of a visual recognition equipment for detecting components may well be used in place of the camera 12 by switching optical systems. In the electronic-component mounting apparatus 1 described above, when any printed circuit board 2 for which the mounting-order NC data has not been generated yet is taken in by the inlet conveyer 3, it is placed on the X-Y table 4, and all printed patterns on the printed circuit board 2 are photographed by the camera 12. FIG. 3 is a diagram obtained in such a way that some of the printed patterns 15 on the printed circuit board 2 are photographed by the camera 12. The printed patterns 15 consist of square pads (electric terminals) 16 and electric patterns of fine wiring lines 17. Letters or symbols 18 expressive of the types or characteristics of the electronic components are printed near the pads 16. Referring to FIG. 3, owing to the paired pads 16, the X- and Y- coordinates of the mounting position of the electronic component can be evaluated at the middle position of these pads. Further, owing to the fact that the paired pads 16 lie horizontally, it can be recognized that the mounting angle $\theta$ of the electronic component is 0°. Besides, in a case where the electronic component has three terminals (as denoted by symbol Q209 in FIG. 3), the coordinates X, Y and $\theta$ of the mounting position can be similarly evaluated from the array of the corresponding pads. Moreover, in mounting any polarized electronic component, such a symbol as $\oplus$ or $\ominus$ is printed near the pads beforehand. Thus, the mounting angle of the polarized component can be evaluated by recognizing the symbol. Incidentally, the details of a technique for recognizing the data of the coordinates X, Y and $\theta$ are disclosed in, for example, Japanese Utility Model Registration Application Laid-open No. 55370/1987.

As thus far described, the pad array of the printed patterns of the printed circuit board and the letters or symbols printed nearby are recognized by the camera and the image processor which are included in the electronic-component mounting apparatus, whereby the X-, Y- and $\theta$-coordinates of the mounting positions of the electronic components and the types of these components can be found, and the mounting-order NC data can be automatically generated on the basis of the above data items found. In determining the mounting order, it is preferable to minimize the period of time for mounting all the electronic components. By way of example, when the electronic components of an identical type are successively mounted, the operating time of the component feed table 5 can be rendered zero while the identical components are being mounted. In addition, the operating time of the X-Y table 4 can be minimized in such a way that the component to be subsequently selected is mounted so as to minimize the movement magnitude of the X-Y table 4. The optimum mounting order is determined considering these facts. As a result, such a labor as manually generating NC data through the keyboard of a data generation equipment can be saved. Especially in a case where various products are manufactured in small quantities and where the number of lots is large, much labor has heretofore been expended on the generation of the NC data for lot sizes. In contrast, according to the apparatus of the present invention, the apparatus itself generates the NC data automatically, and hence, the labor-saving effect is very great. Moreover, since the apparatus generates the NC data from the actual printed circuit board itself, it produces also the effect that the data generation is not affected by the quality of finish of the printed circuit board.

Incidentally, in a case where, regarding a printed circuit board on which components are to be mounted, there are CAD data for the fabrication of the printed circuit board, the mounting order of the components to be mounted may well be determined on the basis of the CAD data. More specifically, in general, the operating time of the X-Y table can be rendered the shortest in such a way that the X-Y table is successively moved in the same sequence as the sequence in which printed patterns on the printed circuit board have been drawn. Besides, the rough mounting positions of the components to-be-mounted can be recognized from the CAD data. Accordingly, a mounting-order program can be efficiently generated in such a way that the mounting order and the rough mounting positions of the components to be mounted are recognized on the basis of the CAD data, and that the precise mounting positions and mounting attitudes of the components to be mounted are recognized by processing an image from the camera.

Next, a practicable example in which the coordinates X, Y and $\theta$ are evaluated by the apparatus of the present invention will be described with reference to FIG. 4.

Figure 4:
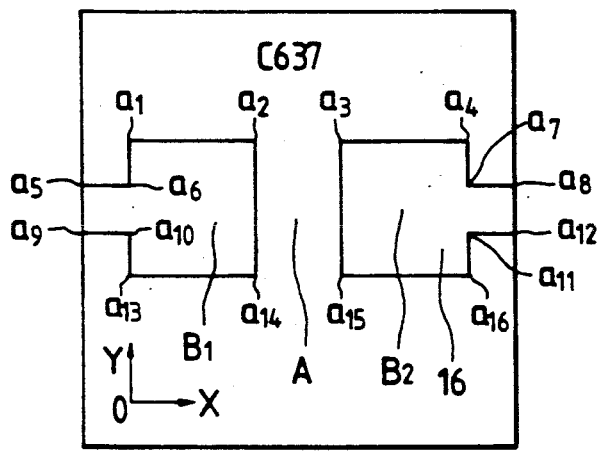
FIG. 4 is a diagram for explaining a practicable example in which a position for mounting a component in correspondence with a pair of pads is found by image processing.

First, one pair of pads are binary-coded to obtain a pattern as shown in FIG. 4. Thereafter, the whole image is scanned successively from the leftmost and uppermost pixel so as to extract the variation points of pixels. The points are denoted by $a_i$ (i=1 thru 16) in FIG. 4. Simultaneously with the extraction of the variation points, the X-Y coordinates of the respective points are evaluated from the origin of the printed circuit board 2, the movement magnitudes of the X-Y table 4 and a coordinate system in the camera 12. On the basis of the points, the values X, Y and $\theta$ of the mounting position of the NC data are obtained as stated below.

From among these points, the eight points $a_1$, $a_2$, $a_3$, $a_4$, $a_{13}$, $a_{14}$, $a_{15}$ and $a_{16}$ corresponding to the four corners of each of the pads are selected, and the point A ($X_0$, $Y_0$) of the mounting position is calculated from the $X_i$- and $Y_i$-coordinates of the selected points by the following formulae:

$$X_0 = (X_1 + X_2 + X_3 + X_4 + X_{13} + X_{14} + X_{15} + X_{16})/8$$

$$Y_0 = (Y_1 + Y_2 + Y_3 + Y_4 + Y_{13} + Y_{14} + Y_{15} + Y_{16})/8$$

where $(X_i, Y_i)$ denotes the X-Y coordinates of the points $a_i$.

Since only four directions at 45° pitches are usually pertinent, the $\theta$-coordinate value is found by executing the following decisions in succession:

(i) If the eight points have two sets each consisting of four points of almost equal Y-coordinates, then the $\theta$-coordinate value is 0°.

(ii) If the eight points have two sets each consisting of four points of almost equal X-coordinates, then the $\theta$-coordinate value is 90°.

Figure 5:
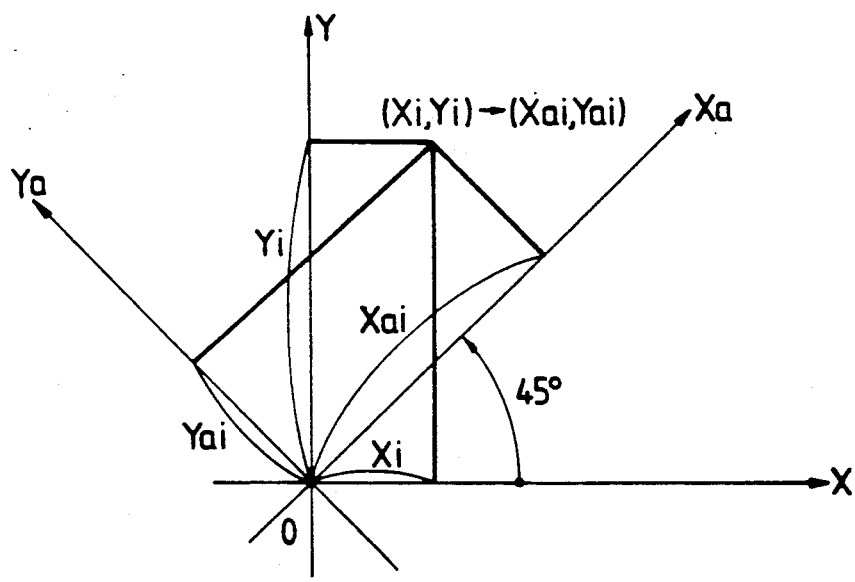
FIG. 5 is a diagram showing a practicable example which obtains a θ-coordinate value.

(iii) In a case where neither of the above items (i) and (ii) holds, a coordinate transform illustrated in FIG. 5 is performed. Specifically, new coordinates $(X_{ai}, Y_{ai})$ are evaluated by the following formulae:

$$X_{ai} = \frac{X_i}{\sqrt{2}} + \frac{Y_i}{\sqrt{2}}$$

$$Y_{ai} = -\frac{X_i}{\sqrt{2}} + \frac{Y_i}{\sqrt{2}}$$

(iii-1) If the eight points have two sets each consisting of four points of almost equal $Y_a$-coordinates in the new coordinate system, then the $\theta$-coordinate value is 45°.

(iii-2) If the eight points have two sets each consisting of four points of almost equal $X_a$-coordinates in the new coordinate system, then the $\theta$-coordinate value is $-45°$.

Regarding the polarized component, the direction thereof is found by recognizing the symbol $\oplus$ or $\ominus$ as stated before.

As another expedient for obtaining the $\theta$-coordinate value, a symbol, a drawing pattern or the like denoting a mounting angle is indicated near the letter pattern, and the mounting angle is recognized by the image processing. Thus, any mounting angle can be promptly recognized.

In the way described above, the coordinates X, Y and $\theta$ can be evaluated from the configuration of the pads of the printed patterns.

Next, another example for evaluating the coordinates X, Y and $\theta$ will be described.

Figure 6:
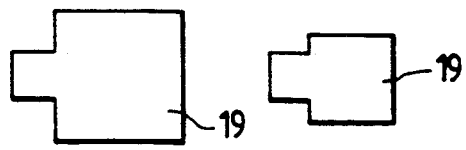
FIG. 6 is a diagram showing examples of known patterns of pads.

This example is a method which applies pattern matching being one technique of visual recognition. Pad configurations are in one-to-one correspondence with the shapes of components, and the component shapes are of several dozen types. Therefore, letters are first recognized on a printed circuit board so as to find the shape of a component to-be-mounted. Subsequently, the known patterns 19 of pads corresponding to the component shapes and stored beforehand as shown in FIG. 6 are subjected to pattern matching with the pair of pads in FIG. 4. According to the pattern matching, the X-Y coordinates of an image can be evaluated by the superposition between the image and the known pattern. Such points are points $B_1$ $(X_{b1}, Y_{b1})$ and $B_2$ $(X_{b2}, Y_{b2})$ in FIG. 4. When the two points are found, the point A $(X_0, Y_0)$ of the mounting position can be calculated by the following formulae:

$$X_0 = (X_{b1} + X_{b2})/2$$

$$Y_0 = (Y_{b1} + Y_{b2})/2.$$

Besides, the $\theta$-coordinate value can be obtained by the same evaluating method stated before.

In the way described above, it becomes possible to evaluate the respective coordinates X, Y and $\theta$ from the pad configuration of the printed patterns.

According to the present invention, when a printed circuit board is merely caused to be fed into an electronic-component mounting apparatus, the mounting apparatus itself recognizes the types of electronic components to-be-mounted and the mounting positions and mounting attitudes thereof by means of a camera and an image processor, and it can mount the predetermined electronic components on the predetermined positions of the printed circuit board at the predetermined attitudes. Accordingly, the operator's operation of inputting mounting-order NC data from a keyboard every lot can be dispensed with, and labor can be sharply saved. Moreover, according to the present invention, the mounting-order NC data is automatically generated for various printed circuit boards. Therefore, mounting data for the various printed circuit boards need not be stored in a data file or the like beforehand, and the printed circuit board fed in can be coped with irrespective of the kind thereof.

Further, the printed circuit board set on an X-Y table is photographed, and the obtained image is subjected to image processing, whereby precise X-, Y- and $\theta$-coordinates on the X-Y table can be evaluated, and the electronic components can be mounted on the printed circuit board without mounting errors by mounting the components in conformity with the evaluated coordinates as they are.

What is claimed is:

1. An electronic-component mounting apparatus comprising:

component feed means for feeding electronic components;

an X-Y table on which a printed circuit board is placed;

component mounting means operatively associated with the component feed means and the X-Y table for mounting the electronic components from said component feed means on predetermined positions of the printed circuit board;

a camera which is disposed over said X-Y table, and which photographs printed patterns and component information of the printed circuit board;

an image processor operatively associated with the camera which stores therein known patterns corresponding to all pad patterns printed on printed circuit boards and known letter patterns indicating types of electronic components, and which processes an image photographed by said camera and recognizes the letter pattern and the pad patterns on the printed circuit board agreeing with the known patterns, to recognize the type of the component from the recognized letter pattern and to recognize coordinates of pads near the letter pattern, thereby to determine a mounting position and a mounting angle of the recognized electronic component; and control means operatively associated with the image processor for controlling the component feed means, the X-Y table, and the component mounting means so that the recognized type of electronic component is mounted on the determined position of the printed circuit board at the determined mounting angle on the basis of the information from said image processor.

2. An electronic-component mounting apparatus according to claim 1, wherein said image processor has an algorithm which recognizes the large number of electronic components to be mounted on the printed circuit boards, and which determines orders of mounting the electronic components on the printed circuit boards.

3. An electronic-component mounting apparatus according to either of claims 1 and 2, wherein said image processor processes the image supplied from said camera, so as to evaluate X-, Y- and θ-coordinates of the electronic components to-be-mounted on said X-Y table.

4. An electronic-component mounting apparatus according to claim 3, further comprising data optimum-edit program generation means operatively associated with the image processor and the control means for determining an order of mounting the electronic components so as to attain a shortest time for mounting the electronic components on the whole printed circuit board, on the basis of the type data of the electronic components-to-be-mounted and the X-, Y- and θ-coordinate data of the mounting positions of the electronic components as obtained from said image processor.

5. An electronic-component mounting apparatus according to claim 2, further comprising means operatively associated with the image processor and the control means for successively moving said X-Y table in accordance with CAD data in the case where the printed circuit boards are fabricated with a CAD technique, the electronic components being mounted on the predetermined positions on the basis of the CAD data and information from said image processor.

6. An electronic-component mounting apparatus comprising:
component feed means for feeding electronic components;
an X-Y table on which a printed circuit board is placed;
component mounting means operatively associated with the component feed means and the X-Y table for mounting the electronic components from said component feed means on predetermined positions of the printed circuit board;
a camera which is disposed over said X-Y table, and which photographs printed patterns of the printed circuit board and component information thereof near the printed patterns;
an image processor operatively associated with the camera which processes an image photographed by said camera, to recognize a type of the electronic component to-be-mounted from a letter pattern indicating the component information and to evaluate coordinates of pad patterns near the component and recognize the mounting position and a mounting attitude of the electronic component to-be-mounted; and
control means operatively associated with the image processor for controlling the component feed means, the X-Y table, and the component mounting means so that the recognized type of electronic component to-be-mounted is mounted on the recognized position of the printed circuit board at the recognized attitude on the basis of the information from said image processor.

7. An electronic-component mounting apparatus according to claim 6, wherein said image processor recognizes all the electronic components to be mounted on the printed circuit board and determines an order of mounting the electronic components on the printed circuit board, by means of a data optimum-edit program which attains a shortest mounting time.

8. An electronic-component mounting apparatus comprising:
component feed means for feeding electronic components;
a table on which a printed circuit board is placed;
component mounting means operatively associated with the component feed means and the table for mounting the electronic components from said component feed means on predetermined positions of the printed circuit board;
a camera which photographs printed patterns on the printed circuit board and component information near the printed patterns;
an image processor operatively associated with the camera which processes an image photographed by said camera, to recognize the mounting positions and mounting attitudes of the electronic components to-be-mounted and to generate a mounting order program for determining an order of mounting the electronic components to-be-mounted on the printed circuit board; and
control means operatively associated with the image processor for controlling the component feed means, the table, and the component mounting means so that the electronic components to-be-mounted are successively mounted in the determined order on the recognized positions of the printed circuit board at the recognized attitudes on the basis of the information from said image processor.

9. An electronic-component mounting apparatus according to claim 8, wherein said image processor generates the mounting order and determines rough mounting positions of the components to-be-mounted on the basis of CAD data in the case where the printed circuit board is fabricated with a CAD technique, and processes the image from said camera to recognize the precise mounting positions and the mounting attitudes of the components to-be-mounted.

10. An electronic-component mounting method comprising the steps of photographing printed patterns on a printed circuit board and component information near the printed patterns, recognizing a letter pattern indicative of the component information and pad patterns near the letter pattern from an image photographed, recognizing a type of the electronic component to-be-mounted from the letter pattern and a mounting position and a mounting attitude of the electronic component to-be-mounted from the pad patterns, and mounting the predetermined electronic component on the predetermined position of the printed circuit board at the predetermined attitude on the basis of the above information.

11. An electronic-component mounting method comprising the steps of photographing printed patterns on a printed circuit board and component information on types of components near the printed patterns, recognizing letter patterns indicative of the component information and pad patterns near the letter patterns from an image photographed, recognizing the types of the electronic components to-be-mounted from the letter patterns and mounting positions and mounting attitudes of the electronic components to-be-mounted from the pad patterns, further determining an order of mounting the electronic components to-be-mounted on the printed circuit board, and subsequently mounting the predetermined electronic components on the predetermined positions of the printed circuit board at the predetermined attitudes successively in the predetermined order.

12. An electronic-component mounting method comprising the steps of:
   photographing printed patterns on a printed circuit board and component information on types of components near the printed patterns;
   determining the types and a mounting order of the electronic components to-be-mounted on the basis of an image photographed and CAD data in the case where the printed circuit board is fabricated with a CAD technique;
   further recognizing mounting positions and mounting attitudes of the electronic components to-be-mounted; and
   subsequently mounting the predetermined electronic components on the predetermined positions of the printed circuit board at the predetermined attitudes successively in the predetermined order.

13. An electronic-component mounting method comprising the steps of storing known pad patterns which correspond to all pad patterns printed on a printed circuit board, and known letter patterns which indicate electronic components; photographing printed patterns on a printed circuit board and component information near the printed patterns; recognizing letter patterns aggreeing with the known letter patterns from an image photographed, and also recognizing pad patterns agreeing with the known pad patterns near the recognized letter patterns; recognizing types of the electronic components to-be-mounted from the recognized letter patterns and mounting positions and mounting attitudes of the electronic components to-be-mounted from the recognized pad patterns; and successively mounting the predetermined electronic components on the predetermined positions of the printed circuit board at the predetermined attitudes on the basis of the above information.

14. An electronic-component mounting apparatus comprising:
   component feed means for feeding electronic components;
   an X-Y table on which a printed circuit board is placed;
   component mounting means operatively associated with the component feed means and the X-Y table for mounting the electronic components from said component feed means on predetermined positions of the printed circuit board;
   a camera which is disposed on said X-Y table, and which photographs printed patterns and component information of the printed circuit board;
   memory means for storing known patterns corresponding to all pad patterns printed on printed circuit boards and known letter patterns indicating types of electronic components;
   processing means operatively associated with the camera and the memory means for processing an image photographed by said camera, to recognize letter patterns on the printed circuit board and pad patterns near the letter patterns as agreeing with the known patterns stored in said memory means;
   image processing means operatively associated with the processing means for recognizing the types of the electronic components to-be-mounted from the recognized letter patterns and also recognizing coordinates of pads from the recognized pad patterns, thereby to determine the mounting positions and mounting angles of the electronic components to-be-mounted; and
   control means operatively associated with the image processing means for controlling the component feed means, the X-Y table, and the component mounting means to mount the recognized types of electronic components to-be-mounted on the determined positions of the printed circuit board at the determined mounting angles on the basis of the information from said image processing means.

* * * * *